United States Patent
Peng et al.

(10) Patent No.: US 10,411,220 B2
(45) Date of Patent: Sep. 10, 2019

(54) OLED DISPLAY WITH AN ENCAPSULATION WITH A PLURALITY OF INORGANIC LAYERS

(71) Applicant: WUHAN CHINA STAR OPTOELECTRONICS TECHNOLOGY CO., LTD., Wuhan (CN)

(72) Inventors: Simin Peng, Wuhan (CN); Jiangjiang Jin, Wuhan (CN); Hsianglun Hsu, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 0 days.

(21) Appl. No.: 15/566,731

(22) PCT Filed: May 18, 2017

(86) PCT No.: PCT/CN2017/084852
§ 371 (c)(1),
(2) Date: Oct. 16, 2017

(87) PCT Pub. No.: WO2018/192044
PCT Pub. Date: Oct. 25, 2018

(65) Prior Publication Data
US 2019/0051862 A1  Feb. 14, 2019

(30) Foreign Application Priority Data
Apr. 19, 2017  (CN) .......................... 2017 1 0258379

(51) Int. Cl.
*H01L 29/08* (2006.01)
*H01L 33/00* (2010.01)
(Continued)

(52) U.S. Cl.
CPC ........ *H01L 51/5256* (2013.01); *H01L 51/524* (2013.01); *H01L 51/5253* (2013.01); *H01L 51/56* (2013.01)

(58) Field of Classification Search
CPC .... H01L 51/5256; H01L 51/524; H01L 51/56
See application file for complete search history.

(56) References Cited

U.S. PATENT DOCUMENTS 9,431,634 B2 * 8/2016 Song .................. H01L 51/5262
9,887,383 B2 2/2018 Mu
(Continued)

FOREIGN PATENT DOCUMENTS

CN  105024016 A  11/2015
CN  105118933 A  12/2015
(Continued)

Primary Examiner — Alonzo Chambliss
(74) Attorney, Agent, or Firm — JMB Davis Ben-David (57) ABSTRACT

A display panel and a manufacturing method thereof are provided. The display panel includes a substrate, a display device and an encapsulant, and the display device are arranged on the substrate. The encapsulant covers the edge of the display device and the substrate. The encapsulant includes at least two inorganic encapsulation layers and at least one organic encapsulation layer; the at least two inorganic encapsulating layers and the at least one organic encapsulating layer are alternately stacked with each other and integrated as a whole in a direction perpendicular to the substrate. Thus, the display device in the display panel can be prevented from contacting with water and oxygen.

12 Claims, 4 Drawing Sheets (51) Int. Cl.
*H01L 51/52* (2006.01)
*H01L 51/56* (2006.01)

(56) References Cited

U.S. PATENT DOCUMENTS

| | | | | |
|---|---|---|---|---|
| 2008/0018230 A1* | 1/2008 | Yamada | ................ | B32B 27/00 |
| | | | | 313/498 |
| 2010/0227422 A1* | 9/2010 | Sasaki | ................ | C23C 17/0652 |
| | | | | 438/26 |
| 2011/0140164 A1* | 6/2011 | Seo | ................ | H01L 51/5256 |
| | | | | 257/100 |
| 2015/0048331 A1* | 2/2015 | Kwack | ................ | H01L 51/5253 |
| | | | | 257/40 |
| 2015/0144930 A1* | 5/2015 | Kim | ................ | H01L 51/5256 |
| | | | | 257/40 |
| 2015/0162565 A1* | 6/2015 | Ryu | ................ | H01L 51/5256 |
| | | | | 257/40 |
| 2016/0137769 A1* | 5/2016 | Kwack | ................ | C07C 69/54 |
| | | | | 257/40 |
| 2018/0123087 A1 | 5/2018 | Tang | | |

FOREIGN PATENT DOCUMENTS

| | | |
|---|---|---|
| CN | 105304676 A | 2/2016 |
| CN | 105514298 A | 4/2016 |
| CN | 105938873 A | 9/2016 |
| CN | 106328825 A | 1/2017 |
| KR | 20130040574 A | 4/2013 |

\* cited by examiner

OLED DISPLAY WITH AN ENCAPSULATION WITH A PLURALITY OF INORGANIC LAYERS

CROSS REFERENCE TO RELATED APPLICATIONS

This application is a U.S. National Phase application submitted under 35 U.S.C. § 371 of Patent Cooperation Treaty Application serial No. PCT/CN2017/084852, filed on May 18, 2017, which claims the priority of China Patent Application serial No. 201710258379.X, filed on Apr. 19, 2017, the disclosures of which are incorporated herein by reference in their entirety.

FIELD OF THE INVENTION

The present invention relates to the field of display technology, and more particularly to a display panel and a method of manufacturing the same.

BACKGROUND OF THE INVENTION

Conventionally, organic materials of organic light emitting diode (OLED) display panels are prone to react with water and oxygen. Therefore, with respect to conventional OLED display panels, isolation of the organic materials and water or oxygen is particularly important.

The conventional OLED display panel uses an encapsulant that encapsulates the display device (containing organic material) in the OLED display panel.

However, in practice, the encapsulation in the conventional OLED display panels is poor. After an extended period of time, conventional OLED display panels in display devices (containing organic material) will contact with water and oxygen, resulting in improper display of the conventional OLED display panel described above.

Therefore, it is necessary to propose a new technical solution to solve the above technical problems.

SUMMARY OF THE INVENTION

An object of the present invention is to provide a display panel and a manufacturing method thereof, which can effectively prevent the display device in the display panel from contacting with water and oxygen.

In order to solve the above-mentioned problems, the technical solution of the present invention is as follows:

A display panel is provided, and comprises: a substrate; a display device disposed on the substrate; an encapsulant covering an edge portion of the display device and an edge portion of the substrate, the encapsulant including: at least two inorganic encapsulating layers; and at least one organic encapsulating layer; wherein the at least two inorganic encapsulating layers and the at least one organic encapsulating layer are alternately stacked with each other and integrated as a whole in a direction perpendicular to the substrate; wherein the at least two inorganic encapsulating layers includes: a first inorganic encapsulating layer; and at least one second inorganic encapsulating layer; wherein the organic encapsulating layer is disposed between the first inorganic encapsulating layer and the second inorganic encapsulating layer, and/or the organic encapsulation layer is disposed between two of the second inorganic encapsulation layers adjacent to each other in the direction perpendicular to the substrate; wherein the organic encapsulating layer is configured to enhance a light transmittance of the display panel and to planarize an uneven surface of the inorganic encapsulation layer; wherein the organic encapsulating layer is configured to reduce stress generated while the display panel is bent and to improve a flexibility of the display panel; wherein a thickness of the inorganic encapsulating layer is 0.5 to 1 µm; and wherein the encapsulant is configured to seal the display device to prevent the display device from contacting with water and oxygen.

The display panel according to the present invention as described above, the first inorganic encapsulating layer is formed by depositing an inorganic material on the edge portion of the display device and the edge portion of the substrate; the organic encapsulating layer is formed by forming an organic liquid film on the first inorganic encapsulating layer and exposing the organic liquid film with an ultraviolet light to cure the organic liquid film; and the second inorganic encapsulating layer is formed by depositing an inorganic material on the organic encapsulating layer.

The display panel according to the present invention as described above, the organic liquid film is formed by mixing silicon nitride nanoparticles into an organic solution and disposing the organic solution mixed with the silicon nitride nanoparticles onto the inorganic encapsulating layers through spin-coating or jet-printing.

The display panel according to the present invention as described above, wherein an organic material corresponding to the organic solution is 1,1,2,2,9,9,10,10-octafluoro[2.2]paracyclophane.

Furthermore, a display panel is provided, and comprises: a substrate; a display device disposed on the substrate; an encapsulant covering an edge portion of the display device and an edge portion of the substrate, the encapsulant including: at least two inorganic encapsulating layers; and at least one organic encapsulating layer; wherein the at least two inorganic encapsulating layers and the at least one organic encapsulating layer are alternately stacked with each other and integrated as a whole in a direction perpendicular to the substrate.

The display panel according to the present invention as described above, the at least two inorganic encapsulating layers comprise: a first inorganic encapsulating layer; and at least one second inorganic encapsulating layer; wherein the organic encapsulating layer is disposed between the first inorganic encapsulating layer and the second inorganic encapsulating layer, and/or the organic encapsulation layer is disposed between two of the second inorganic encapsulation layers adjacent to each other in the direction perpendicular to the substrate.

The display panel according to the present invention as described above, wherein the encapsulant comprises one of the first inorganic encapsulating layer, a first organic encapsulating layer, one of the second inorganic encapsulating layer, a second organic encapsulating layer and a third inorganic encapsulating layer; wherein the first inorganic encapsulating layer is disposed on the edge portion of the display device and the edge portion of the substrate; and the first organic encapsulating layer is disposed between the first inorganic encapsulating layer and the second inorganic encapsulating layer in the direction perpendicular to the substrate; and the second organic encapsulating layer is disposed between the second inorganic encapsulating layer and the third inorganic encapsulating layer.

The display panel according to the present invention as described above, wherein the first inorganic encapsulating layer is formed by depositing an inorganic material on the edge portion of the display device and the edge portion of the substrate; the organic encapsulating layer is formed by forming an organic liquid film on the first inorganic encapsulating layer and exposing the organic liquid film with an ultraviolet light to cure the organic liquid film; and the second inorganic encapsulating layer is formed by depositing an inorganic material on the organic encapsulating layer.

The display panel according to the present invention as described above, wherein the organic encapsulating layer is formed by forming the organic liquid film on the inorganic encapsulating layer, and exposing the organic liquid film with the ultraviolet light each a predetermined time, so that the organic liquid film is completely reacted in the predetermined time, such that the organic liquid film is completely cured.

The display panel according to the present invention as described above, wherein the organic liquid film is formed by mixing silicon nitride nanoparticles into an organic solution and disposing the organic solution mixed with the silicon nitride nanoparticles onto the inorganic encapsulating layers through spin-coating or jet-printing.

The display panel according to the present invention as described above, an organic material corresponding to the organic solution is 1,1,2,2,9,9,10,10-Octafluoro[2.2] paracyclophane.

The display panel according to the present invention as described above, the organic encapsulating layer is configured to enhance a light transmittance of the display panel and to planarize the inorganic encapsulation layer.

The display panel according to the present invention as described above, the organic encapsulating layer is configured to planarize an uneven surface of the inorganic encapsulation layer.

The display panel according to the present invention as described above, the organic encapsulating layer is configured to release stress generated while the display panel is bent and to improve a flexibility of the display panel.

The display panel according to the present invention as described above, a thickness of the inorganic encapsulating layer is 0.5 to 1 µm.

The display panel according to the present invention as described above, the encapsulant is configured to seal the display device to prevent the display device from contacting with water and oxygen.

Moreover, a method of manufacturing a display panel as described above is provided, and comprises the steps of: (A) forming the display device on the substrate; and (B) forming the encapsulant on the edge portion of the display device and the edge portion of the substrate; wherein the encapsulant including: at least two inorganic encapsulating layers and at least one organic encapsulating layer, and wherein the at least two inorganic encapsulating layers and the at least one organic encapsulating layer are alternately stacked with each other and integrated as a whole in a direction perpendicular to the substrate.

The method of manufacturing the display panel according to the present invention as described above, the at least two inorganic encapsulating layers includes: a first inorganic encapsulating layer; and at least one second inorganic encapsulating layer; wherein the organic encapsulating layer is disposed between the first inorganic encapsulating layer and the second inorganic encapsulating layer, or the organic encapsulation layer is disposed between two of the second inorganic encapsulation layers adjacent to each other in the direction perpendicular to the substrate.

The method of manufacturing the display panel according to the present invention as described above, the step (B) comprises steps of: (b1) depositing an inorganic material on the edge of the display device and the edge of the substrate to form the first inorganic encapsulating layer; (b2) forming an organic liquid film on the first inorganic encapsulating layer and exposing the organic liquid film with an ultraviolet light to cure the organic liquid film to form the organic encapsulating layer; and (b3) depositing an inorganic material on the organic encapsulating layer to form the second inorganic encapsulating layer.

The method of manufacturing the display panel according to the present invention as described above, the step (b2) comprises steps of: (b21) mixing silicon nitride nanoparticles into an organic solution; (b22) disposing the organic solution mixed with the silicon nitride nanoparticles onto the inorganic encapsulating layers through spin-coating or jet-printing; and (b23) exposing the organic liquid film with the ultraviolet light to cure the organic liquid film to form the organic encapsulation layer.

In contrast to prior art, since the encapsulant of the present invention includes at least two inorganic encapsulating layers and at least one organic encapsulating layer, the at least two inorganic encapsulating layers and the at least one organic encapsulating layer are alternately stacked with each other and integrated as a whole in a direction perpendicular to the substrate, and thus can effectively prevent the display device in the display panel from contacting the water in water.

DESCRIPTION OF THE DRAWINGS

In order to make the present invention described above easy to understand, the preferred embodiments will be described thereafter, and will be described in detail with reference to the drawings.

DETAILED DESCRIPTION OF THE PREFERRED EMBODIMENTS

The term "embodiment" in the present invention described herein means an example, an exemplary example, or an example illustration. Furthermore, the singular form "a" or "an" used in the specification and the claims may generally be construed as "one or more than one". Unless otherwise specified or from the context can clearly determine the singular form.

A display panel according to the present invention includes a substrate 101, a display device 201, and an encapsulant.

Figure 1:
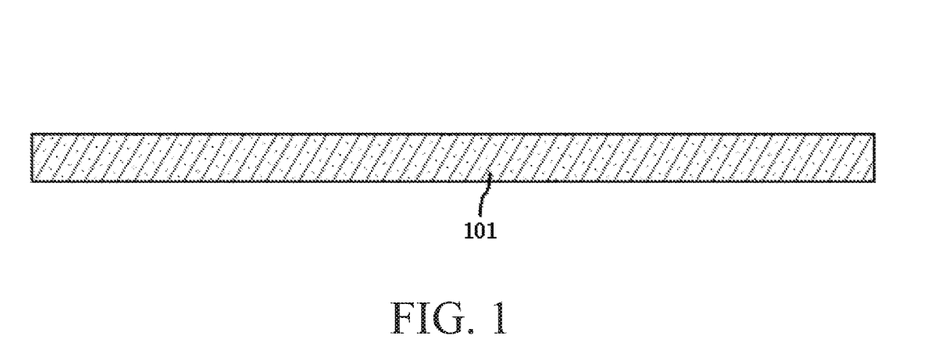
FIGS. 1 to 5 are schematic views illustrating a manufacturing method of the display panel of the present invention.
Figure 2:
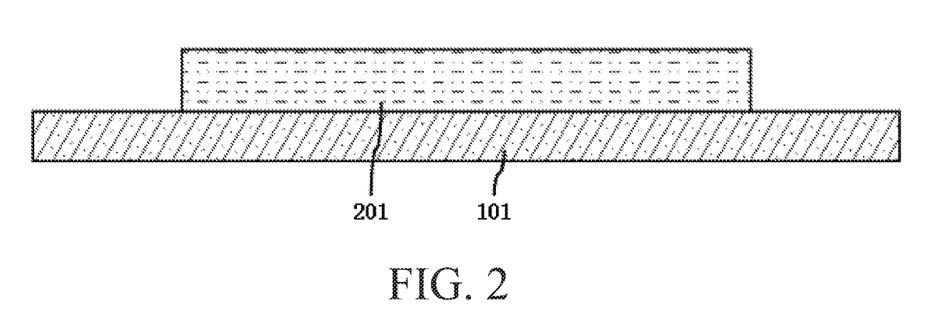

The display device 201 is disposed on a substrate 101. The display device 201 may be an organic light emitting diode (OLED) display device.

Figure 5:
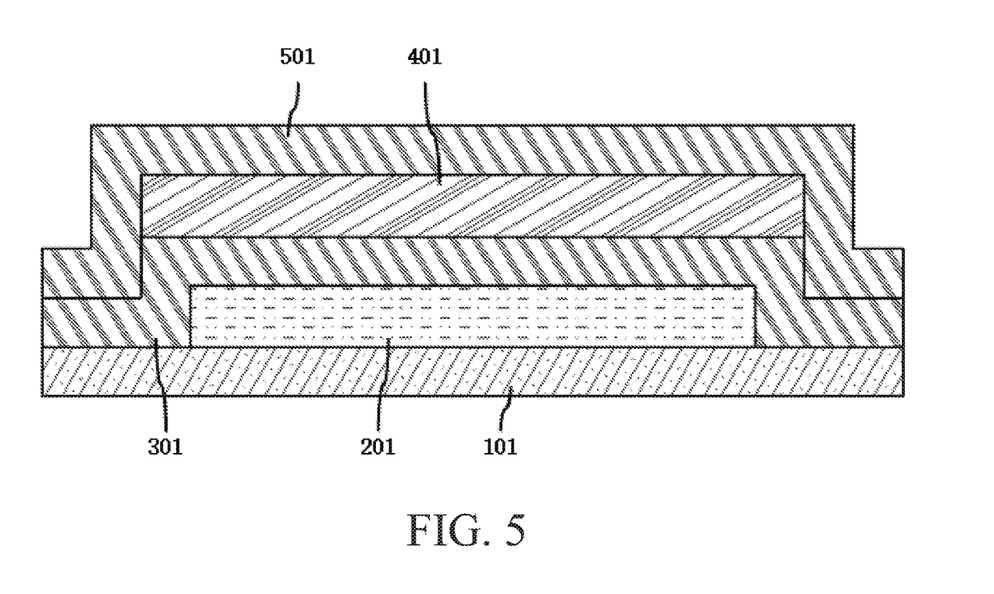

The encapsulant covers an edge portion of the display device 201 and an edge portion of the substrate 101. The encapsulant includes at least two inorganic encapsulating layers and at least one organic encapsulating layer. The at least two inorganic encapsulating layers and the at least one organic encapsulating layer are alternately stacked with each other and integrated as a whole in a direction perpendicular to the substrate 101.

The encapsulant is configured to seal the display device 201 to prevent the display device 201 from the possibility of contacting with water and oxygen.

In the display panel according to the present invention, the at least two inorganic encapsulating layers include a first inorganic encapsulating layer 301 and at least one second inorganic encapsulating layer 501.

The organic encapsulating layer 401 is disposed between the first inorganic encapsulating layer 301 and the second inorganic encapsulating layer 501, and/or, the organic encapsulation layer 401 is disposed between two of the second inorganic encapsulation layers 501 adjacent to each other in the direction perpendicular to the substrate 101.

Preferably, the encapsulant comprise one of the first inorganic encapsulating layer 301, a first organic encapsulating layer, one of the second inorganic encapsulating layer 501, a second organic encapsulating layer, and third inorganic encapsulating layer. The first inorganic encapsulating layer 301 is disposed on the edge portion of the display device 201 and the substrate 101. In the direction perpendicular to the substrate 101, the first organic encapsulating layer is disposed between the first inorganic encapsulating layer 301 and the second inorganic encapsulating layer 501. The second organic encapsulating layer is disposed between the second inorganic encapsulating layer 501 and the third inorganic encapsulating layer.

Figure 3:
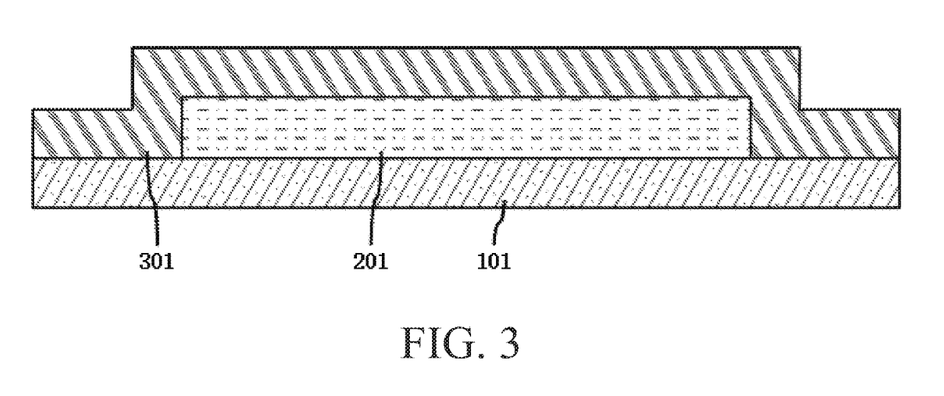

In the display panel according to the present invention, the first inorganic encapsulating layer 301 is formed by depositing an inorganic material on the edge portion of the display device 201 and the edge portion of the substrate 101. Specifically, the first inorganic encapsulating layer 301 is formed by depositing the inorganic material on the edge portion of the display device 201 and the edge portion of the substrate 101 by plasma enhanced chemical vapor deposition (PECVD), atomic layer deposition (ALD), pulsed laser deposition (PLD), sputtering and the like. The inorganic material may be, for example, $Al_2O_3$, $TiO_2$, $SiN_x$, $SiCN_x$, $SiO_x$, and the like.

Figure 4:
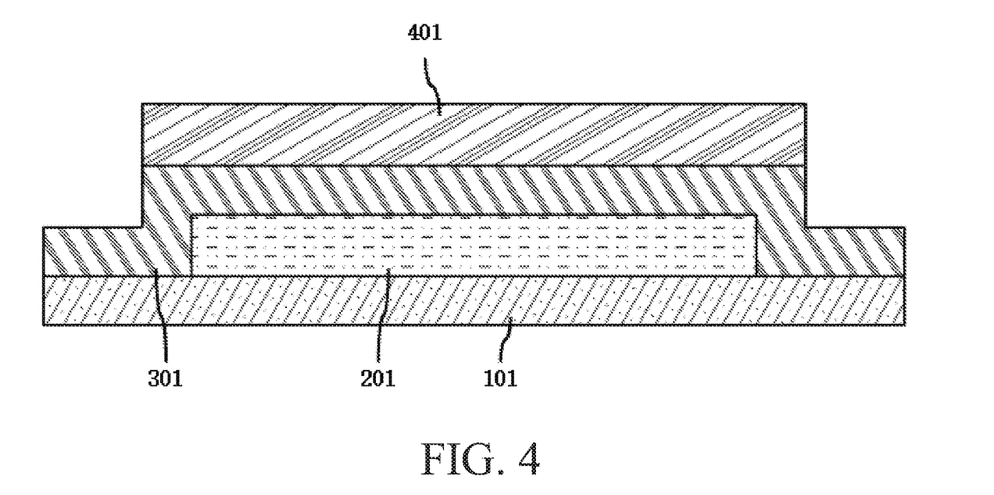

The organic encapsulating layer 401 (the first organic encapsulating layer, the second organic encapsulating layer) is formed by forming an organic liquid film on the inorganic encapsulating layer (the first inorganic encapsulating layer 301, the second inorganic encapsulating layer 501), and utilizing ultraviolet light to irradiate and cure the organic liquid film.

Specifically, the organic encapsulating layer 401 is formed by forming the organic liquid film on the inorganic encapsulating layer (the first inorganic encapsulating layer 301, the second inorganic encapsulating layer 501), and utilizing an ultraviolet light source to irradiate the organic liquid film once every predetermined time, such that the organic liquid film completely reacts at the predetermined time, thereby allowing complete curing of the organic liquid film.

The second inorganic encapsulating layer 501 and the third inorganic encapsulating layer are all formed by depositing an inorganic material on the organic encapsulating layer 401 (the first organic encapsulating layer, the second organic encapsulating layer).

In the display panel according to the present invention, the organic liquid film is formed by mixing silicon nitride nanoparticles ($SiN_x$) into an organic solution, and deposing the organic solution mixed with nanoparticles of the silicon nitride through spin-coating or jet-printing (Jet Print) on the inorganic encapsulating layer (the first inorganic encapsulating layer 301, the second inorganic encapsulating layer 501).

In the display panel according to the present invention, an organic material corresponding to the organic solution is 1,1,2,2,9,9,10,10-octafluoro[2.2] paracyclophane (Octafluoro-(2,2)-paracyclophane, AF4).

In the display panel according to the present invention, the organic encapsulating layer 401 is configured to enhance light transmittance of the display panel, and to planarize the inorganic encapsulating layer. Specifically, the organic encapsulating layer 401 is configured to planarize an uneven surface of the inorganic encapsulating layer (the first inorganic encapsulating layer 301, the second inorganic encapsulating layer 501, the third inorganic encapsulating layer).

The organic encapsulating layer 401 is configured to reduce stress generated while the display panel is bent and to improve flexibility of the display panel.

A thickness of the inorganic encapsulating layer (the first inorganic encapsulating layer 301, the second inorganic encapsulating layer 501, the third inorganic encapsulating layer) is 0.5 μm to 1 μm.

Figure 6:
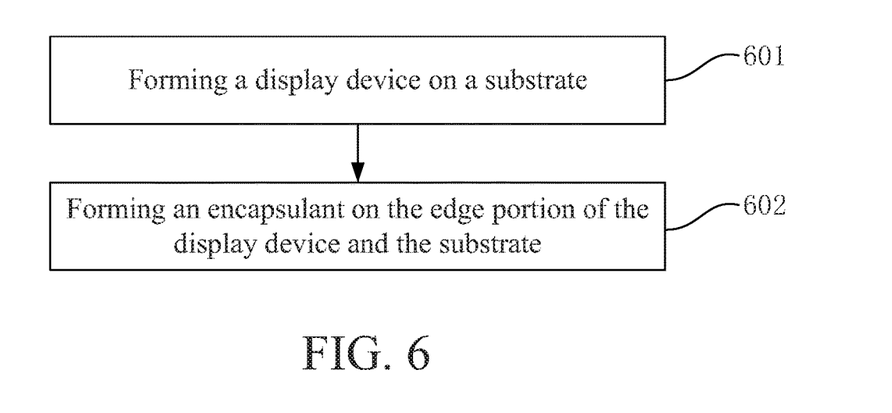
FIG. 6 illustrates a flowchart of a manufacturing method of the display panel of the present invention.

A manufacturing method of the display panel according to the present invention is adapted for manufacturing the display panel according to the present invention. The method for manufacturing the display panel of the present invention comprises the steps of:

A (step 601), forming the display device 201 on the substrate 101; and

B (step 602), forming the encapsulant on the edge portion of the display device 201 and the edge portion of the substrate 101;

wherein the encapsulant includes at least two inorganic encapsulating layers and at least one organic encapsulating layer 401, and wherein the at least two inorganic encapsulating layers and the at least one organic encapsulating layer 401 are alternately stacked with each other and integrated as a whole in a direction perpendicular to the substrate 101.

The encapsulant is configured to seal the display device 201, to prevent the display device 201 from the possibility of contacting with water and oxygen.

In the method of manufacturing the display panel according to the present invention, at least two inorganic encapsulating layer comprises a first inorganic encapsulating layer 301 and at least one second inorganic encapsulating layer 501.

The organic encapsulating layer 401 is disposed between the first inorganic encapsulating layer 301 and the second inorganic encapsulating layer 501, or, the organic encapsulating layer 401 is disposed between two of the second inorganic encapsulation layers 501 adjacent to each other in the direction perpendicular to the substrate 101.

Figure 7:
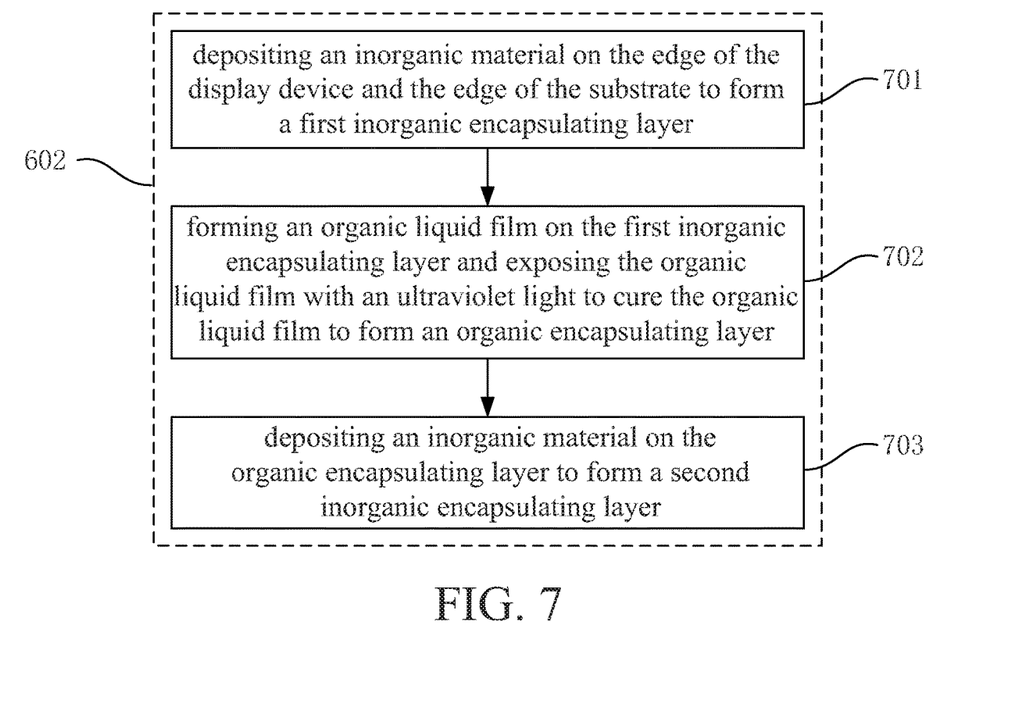
FIG. 7 illustrates a flowchart according to a preferred embodiment of the present invention steps of forming an encapsulant on a display device and an edge of a substrate corresponding to FIG. 6.

In the method of manufacturing the display panel according to the present invention, wherein the step (B) comprises steps of:

b1 (step 701), depositing an inorganic material on the edge of the display device 201 and the edge of the substrate 101 to form the first inorganic encapsulating layer 301, thereby forming the first inorganic encapsulating layer 301. Specifically, the first inorganic encapsulating layer 301 is depositing the inorganic material on the edge portion of the display device 201 and the edge portion of the substrate 101 by plasma enhanced chemical vapor deposition (PECVD), atomic layer deposition (ALD), pulsed laser deposition (PLD), sputtering and the like. The inorganic material may be, for example, $Al_2O_3$, $TiO_2$, $SiN_x$, $SiCN_x$, $SiO_x$, and the like;

b2 (step 702), forming an organic liquid film on the inorganic encapsulating layer (the first inorganic encapsulating layer 301, the second inorganic encapsulating layer 501), and exposing the organic liquid film with an ultraviolet light to cure the organic liquid film to form the organic encapsulating layer 401 (the first organic encapsulating layer, the second organic encapsulating layer). Specifically, forming the organic liquid film the inorganic encapsulating layer (the first inorganic encapsulating layer 301, the second inorganic encapsulating layer 501), and exposing the organic liquid film with an ultraviolet light once every predetermined time, such that the organic liquid film is completely reacted at the predetermined time, thereby allowing the organic liquid film to be completely cured, and thus the organic encapsulating layer 401 is formed; and b3 (step 703), depositing an inorganic material on the organic encapsulating layer 401 (the first organic encapsulating layer, the second organic encapsulating layer) to form the second inorganic encapsulating layer 501.

Repeatedly executing the step b2 and the step b3 can be made the encapsulant having layers of organic encapsulating layer (at least include first organic encapsulating layer and second organic encapsulating layer) and layers of inorganic encapsulating layer (at least include first inorganic encapsulating layer, second inorganic encapsulating layer and third inorganic encapsulating layer).

Figure 8:
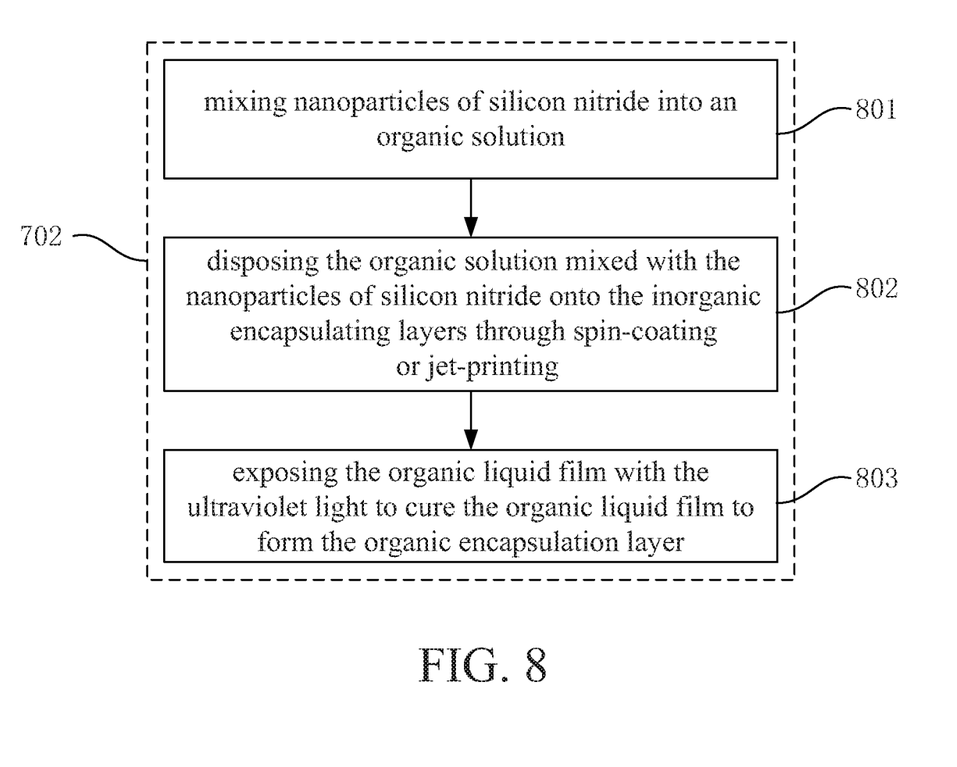
FIG. 8 illustrates a flowchart according to a preferred embodiment of the present invention of forming an organic liquid film on a first inorganic encapsulating layer corresponding to FIG. 7 and irradiating the organic liquid film with ultraviolet light to cure the organic liquid film to form an organic encapsulating layer.

In the display panel according to the present invention, the step b2 comprises steps of:

b21 (step 801), mixing silicon nitride nanoparticles into an organic solution;

b22 (step 802), disposing the organic solution mixed with the silicon nitride nanoparticles onto the inorganic encapsulating layers (the first inorganic encapsulating layer 301, the second inorganic encapsulating layer 501) through spin-coating or jet-printing, so as to form the organic liquid film; and b23 (step 803), exposing the organic liquid film with the ultraviolet light to cure the organic liquid film to form the organic encapsulation layer 401.

According to the present invention, due to the encapsulant of the present invention includes at least two inorganic encapsulating layers and at least one organic encapsulating layer, and the at least two inorganic encapsulating layers and the at least one organic encapsulating layer are alternately stacked with each other and integrated as a whole in a direction perpendicular to the substrate. Thus, the present invention can efficiently prevent the display device from contacting with water and oxygen.

In view of described above, although the present invention has been disclosed by way of preferred embodiments, the above-described preferred embodiments are not intended to limit the present invention, and one of ordinary skill in the art will, without departing from the spirit and scope of the invention, the scope of protection of the present invention is defined by the scope of the claims.

What is claimed is:

1. A display panel, comprising:
   a substrate;
   a display device disposed on the substrate;
   an encapsulant covering an edge portion of the display device and an edge portion of the substrate, the encapsulant including:
   at least two inorganic encapsulating layers; and
   at least one organic encapsulating layer;
   wherein the at least two inorganic encapsulating layers and the at least one organic encapsulating layer are alternately stacked with each other and integrated as a whole in a direction perpendicular to the substrate;
   wherein the at least two inorganic encapsulating layers include:
   a first inorganic encapsulating layer; and
   at least one second inorganic encapsulating layer;
   wherein the organic encapsulating layer is disposed between the first inorganic encapsulating layer and the second inorganic encapsulating layer, and/or the organic encapsulation layer is disposed between two of the second inorganic encapsulation layers adjacent to each other in the direction perpendicular to the substrate;
   wherein the organic encapsulating layer is configured to enhance light transmittance of the display panel and to planarize an uneven surface of the inorganic encapsulation layer;
   wherein the organic encapsulating layer is configured to reduce stress generated while the display panel is bent and to improve flexibility of the display panel;
   wherein a thickness of the inorganic encapsulating layer is 0.5 to 1 μm; and
   wherein the encapsulant is configured to seal the display device to prevent the display device from contacting with water and oxygen,
   wherein the first inorganic encapsulating layer is formed by depositing an inorganic material on the edge portion of the display device and the edge portion of the substrate; the organic encapsulating layer is formed by forming an organic liquid film on the first inorganic encapsulating layer and exposing the organic liquid film with ultraviolet light to cure the organic liquid film; and the second inorganic encapsulating layer is formed by depositing an inorganic material on the organic encapsulating layer,
   wherein the organic liquid film is formed by mixing silicon nitride nanoparticles into an organic solution and disposing the organic solution mixed with the silicon nitride nanoparticles onto the inorganic encapsulating layers through spin-coating or jet-printing.

2. The display panel according to claim 1, wherein an organic material corresponding to the organic solution is 1,1,2,2,9,9,10,10-octafluoro[2.2] paracyclophane.

3. A display panel, comprising:
   a substrate;
   a display device disposed on the substrate;
   an encapsulant covering an edge portion of the display device and an edge portion of the substrate, the encapsulant including:
   at least two inorganic encapsulating layers; and
   at least one organic encapsulating layer;
   wherein the at least two inorganic encapsulating layers and the at least one organic encapsulating layer are alternately stacked with each other and integrated as a whole in a direction perpendicular to the substrate,
   wherein the at least two inorganic encapsulating layers comprise:
   a first inorganic encapsulating layer; and
   at least one second inorganic encapsulating layer;
   wherein the organic encapsulating layer is disposed between the first inorganic encapsulating layer and the second inorganic encapsulating layer, and/or the organic encapsulation layer is disposed between two of the second inorganic encapsulation layers adjacent to each other in the direction perpendicular to the substrate, wherein the first inorganic encapsulating layer is formed by depositing an inorganic material on the edge portion of the display device and the edge portion of the substrate; the organic encapsulating layer is formed by forming an organic liquid film on the first inorganic encapsulating layer and exposing the organic liquid film with an ultraviolet light to cure the organic liquid film; and the second inorganic encapsulating layer is formed by depositing an inorganic material on the organic encapsulating layer, wherein the organic liquid film is formed by mixing silicon nitride nanoparticles into an organic solution and disposing the organic solution mixed with the silicon nitride nanoparticles onto the inorganic encapsulating layers through spin-coating or jet-printing.

4. The display panel according to claim 3, wherein the encapsulant comprises one of the first inorganic encapsulating layer, a first organic encapsulating layer, one of the second inorganic encapsulating layer, a second organic encapsulating layer and a third inorganic encapsulating layer;

wherein the first inorganic encapsulating layer is disposed on the edge portion of the display device and the edge portion of the substrate; and the first organic encapsulating layer is disposed between the first inorganic encapsulating layer and the second inorganic encapsulating layer in the direction perpendicular to the substrate; and the second organic encapsulating layer is disposed between the second inorganic encapsulating layer and the third inorganic encapsulating layer.

5. The display panel according to claim 3, wherein the organic encapsulating layer is formed by forming the organic liquid film on the inorganic encapsulating layer, and exposing the organic liquid film with the ultraviolet light each a predetermined time, so that the organic liquid film is completely reacted in the predetermined time, such that the organic liquid film is completely cured.

6. The display panel according to claim 3, wherein an organic material corresponding to the organic solution is 1,1,2,2,9,9,10,10-Octafluoro[2.2]paracyclophane.

7. The display panel according to claim 3, wherein the organic encapsulating layer is configured to enhance a light transmittance of the display panel and to planarize the inorganic encapsulation layer.

8. The display panel according to claim 7, wherein the organic encapsulating layer is configured to planarize an uneven surface of the inorganic encapsulation layer.

9. The display panel according to claim 3, wherein the organic encapsulating layer is configured to release stress generated while the display panel is bent and to improve a flexibility of the display panel.

10. The display panel according to claim 3, wherein a thickness of the inorganic encapsulating layer is 0.5 to 1 μm.

11. The display panel according to claim 3, wherein the encapsulant is configured to seal the display device to prevent the display device from contacting with water and oxygen.

12. A method of manufacturing a display panel according to claim 5, comprising steps of:
(A) forming the display device on the substrate; and
(B) forming the encapsulant on the edge portion of the display device and the edge portion of the substrate;
wherein the encapsulant includes: at least two inorganic encapsulating layers and at least one organic encapsulating layer, and wherein the at least two inorganic encapsulating layers and the at least one organic encapsulating layer are alternately stacked with each other and integrated as a whole in a direction perpendicular to the substrate,
wherein the at least two inorganic encapsulating layers includes:
a first inorganic encapsulating layer; and
at least one second inorganic encapsulating layer;
wherein the organic encapsulating layer is disposed between the first inorganic encapsulating layer and the second inorganic encapsulating layer, or the organic encapsulation layer is disposed between two of the second inorganic encapsulation layers adjacent to each other in the direction perpendicular to the substrate.
wherein the step (B) comprises steps of:
(b1) depositing an inorganic material on the edge of the display device and the edge of the substrate to form the first inorganic encapsulating layer;
(b2) forming an organic liquid film on the first inorganic encapsulating layer and exposing the organic liquid film with an ultraviolet light to cure the organic liquid film to form the organic encapsulating layer; and
(b3) depositing an inorganic material on the organic encapsulating layer to form the second inorganic encapsulating layer.
wherein the step (b2) comprises steps of:
(b21) mixing silicon nitride nanoparticles into an organic solution;
(b22) disposing the organic solution mixed with the silicon nitride nanoparticles onto the inorganic encapsulating layers through spin-coating or jet-printing; and
(b23) exposing the organic liquid film with the ultraviolet light to cure the organic liquid film to form the organic encapsulation layer.

* * * * *